United States Patent
Jiang et al.

(10) Patent No.: US 10,541,169 B2
(45) Date of Patent: Jan. 21, 2020

(54) METHOD AND SYSTEM FOR BALANCING THE ELECTROSTATIC CHUCKING FORCE ON A SUBSTRATE

(71) Applicant: Applied Materials, Inc., Santa Clara, CA (US)

(72) Inventors: Chong Jiang, Cupertino, CA (US); Lei Jing, Santa Clara, CA (US); Mingte Liu, San Jose, CA (US); Adolph Miller Allen, Oakland, CA (US); Michael W. Johnson, Austin, TX (US); Pallavi Zhang, San Jose, CA (US); Michael D. Armacost, San Jose, CA (US)

(73) Assignee: Applied Materials, Inc., Santa Clara, CA (US)

(*) Notice: Subject to any disclaimer, the term of this patent is extended or adjusted under 35 U.S.C. 154(b) by 366 days.

(21) Appl. No.: 15/593,502

(22) Filed: May 12, 2017

(65) Prior Publication Data

US 2018/0330977 A1    Nov. 15, 2018

(51) Int. Cl.
  *H01L 21/683*     (2006.01)
(52) U.S. Cl.
  CPC .................. *H01L 21/6833* (2013.01)
(58) Field of Classification Search
  CPC .......... H01L 21/6833; H01L 21/0262; H01L 21/67225; H01L 22/14; H01J 37/32715; H01J 37/32091; H01J 37/3299; H01J 37/32697; H01J 37/32706; H01J 37/32935; H01J 37/32577

USPC .......................................... 361/234
  See application file for complete search history.

(56) References Cited

U.S. PATENT DOCUMENTS

| 6,727,655 B2* | 4/2004 | McChesney | H01J 37/32082 |
| | | | 156/345.24 |
| 2006/0256499 A1* | 11/2006 | Yang | H01J 37/32706 |
| | | | 361/234 |
| 2010/0136793 A1* | 6/2010 | Chen | H01J 37/32082 |
| | | | 438/710 |

* cited by examiner

*Primary Examiner* — Kevin J Comber
(74) *Attorney, Agent, or Firm* — Patterson + Sheridan, LLP

(57) ABSTRACT

Embodiments of the disclosure relate to methods and a system for adjusting the chucking voltage of an electrostatic chuck. In one embodiment, a system for plasma processing a substrate includes a plasma processing chamber, a radio-frequency (RF) matching circuit coupled to the chamber, a sensor and a controller. The chamber includes a chamber body having an inner volume, a bipolar electrostatic chuck disposed in the inner volume and a power supply configured to provide chucking voltage to a pair of electrodes embedded within the electrostatic chuck. When plasma is energized within the chamber by the application of RF power through an RF matching circuit, the sensor is configured to detect a change in an electrical characteristic at the RF matching circuit. The controller is coupled to the power supply and configured to adjust the chucking voltage in response to the change in the electrical characteristic detected by the sensor.

17 Claims, 3 Drawing Sheets

METHOD AND SYSTEM FOR BALANCING THE ELECTROSTATIC CHUCKING FORCE ON A SUBSTRATE

BACKGROUND

Field

Embodiments of the disclosure generally relate to methods and a system for balancing the electrostatic chucking force on a substrate disposed on an electrostatic chuck, and methods for processing a substrate using an electrostatic chuck.

Description of the Related Art

In substrate processing equipment, an electrostatic chuck is commonly used for clamping a substrate to a pedestal during a plasma process. The electrostatic chuck clamps the substrate by creating an attractive force between the substrate and the chuck. A chucking voltage is applied to one or more electrodes in the electrostatic chuck to induce oppositely polarized charges in the substrate and the electrodes, respectively. The opposite charges pull the substrate against the electrostatic chuck, thus retaining the substrate.

In a bipolar electrostatic chuck, the electrostatic chuck has a pair of coplanar electrodes embedded within and each electrode is respectively connected to a terminal of a dual power supply. The dual power supply has a common terminal, which is referred to as a center-tap. In order to maintain a constant electrostatic attraction force between the substrate and the chuck, the chucking voltage applied to each electrode of the electrostatic chuck is adjusted in response to changes in voltage detected at the center-tap utilizing a cable coupled to the center-tap. Otherwise, unbalanced chucking voltage could cause the substrate to deform due to an imbalance in electrostatic chucking force. It could also lead to the undesirable generation and deposition of particles on the surface of the substrate.

Some conventional systems for plasma processing a substrate utilize a radio-frequency (RF) power source for driving the plasma within the system. However, the center-tap cable has been known to cause arcing during the plasma processing, which undesirably reduces the life of chamber components and undesirably introduces contaminants into the processing system which are a source of substrate defects.

Thus, there is a need for improved systems and methods for balancing electrostatic chucking force, along with improved methods for processing a substrate on an electrostatic chuck.

SUMMARY

Embodiments of the disclosure relate to methods and a system for balancing the electrostatic chucking force on a substrate by adjusting the chucking voltage of an electrostatic chuck. In one embodiment, a system for plasma processing a substrate includes a plasma processing chamber, a radio-frequency (RF) matching circuit coupled to the chamber, a sensor and a controller. The plasma processing chamber includes a chamber body having an inner volume, a bipolar electrostatic chuck disposed in the inner volume and a power supply configured to provide chucking voltage to a pair of electrodes embedded within the electrostatic chuck. The sensor is configured to detect a change in an electrical characteristic at the RF matching circuit. The controller is coupled to the power supply and configured to adjust the chucking voltage in response to the change in the electrical characteristic detected by the sensor.

Another embodiment of the disclosure provides a method for plasma processing a substrate in a plasma processing chamber. The method includes applying a chucking voltage to an electrostatic chuck supporting the substrate in the chamber, energizing a plasma within the chamber by the application of RF power coupled to the chamber through an RF matching circuit, detecting a change in an electrical characteristic at the RF matching circuit, and adjusting the chucking voltage in response to the change in the electrical characteristic.

Yet another embodiment of the disclosure provides a method for plasma processing a substrate in a plasma processing chamber. The method includes applying a chucking voltage to an electrostatic chuck supporting the substrate in the chamber, energizing a plasma within the chamber by the application of RF power coupled to the chamber through an RF matching circuit, detecting a change in an electrical characteristic at the RF matching circuit, adjusting the chucking voltage in response to the change in the electrical characteristic, and depositing a layer of a material on the substrate by a physical vapor deposition process utilizing the plasma.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

Figure 1:
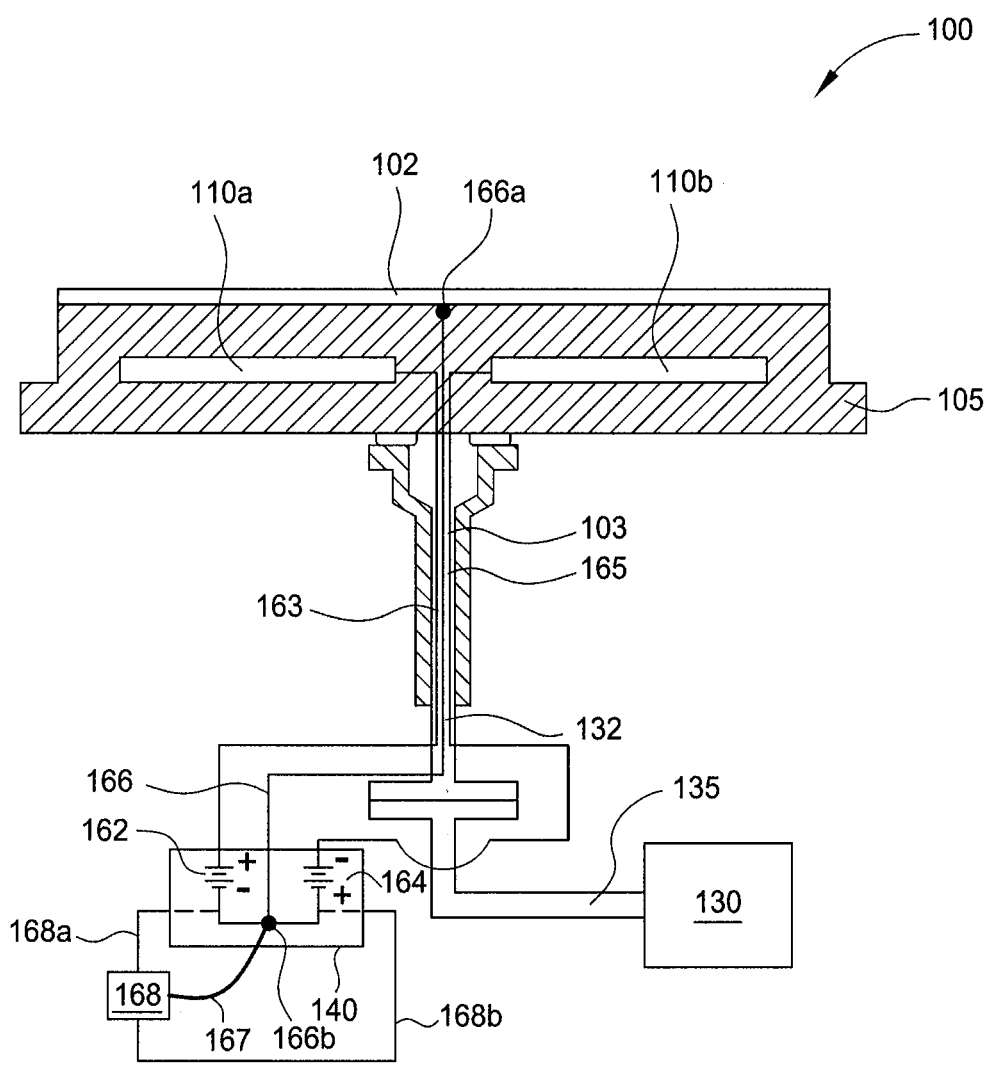
FIG. 1 is a schematic, cross-sectional view of a conventional system for plasma processing a substrate.

To facilitate understanding, identical reference numerals have been used, where possible, to designate identical elements that are common to the figures. It is contemplated that elements and features disclosed in one embodiment may be beneficially incorporated in other embodiments without specific recitation.

DETAILED DESCRIPTION

The system and methods described in this disclosure balance the electrostatic chucking force on a substrate in a plasma processing chamber by detecting a change in an electrical characteristic at the RF matching circuit and predicting the chucking voltage based on the electrical characteristic, thus eliminating the need for the center-tap cable used in conventional systems. As a result, the risk of arcing of the substrate and the chamber is reduced and the yield potential of the substrate is increased.

FIG. 1 is a schematic, cross-sectional view of a conventional system 100 for plasma processing a substrate. As shown in FIG. 1, the system 100 includes a bipolar electrostatic chuck 105 for supporting and retaining a substrate 102 during plasma processing. The electrostatic chuck 105 may be comprised of aluminum (Al) or an aluminum containing ceramic material, such as Al/Al$_2$O$_3$/AlN, or other material.

Referring to FIG. 1, the electrostatic chuck 105 may be moved vertically to facilitate processing and transfer of the substrate 102. The electrostatic chuck 105 may optionally include a substrate spacing mask disposed on the upper surface thereof. The substrate spacing mask may comprise a material, such as but not limited to, titanium, titanium nitride, and diamond-like carbon. The substrate spacing mask is deposited to a pre-defined thickness that maintains the substrate 102 slightly above the surface of the electrostatic chuck 105.

The electrostatic chuck 105 further contains a passage 103 disposed therethrough. In one embodiment, a heat transfer fluid is transported from a gas source 130 through a gas conduit 135 and a conductive gas conduit 132 to the passage 103 extending through the electrostatic chuck 105. The conductive gas conduit 132 is mechanically and electrically coupled to the conductive passage 103, such as by brazing. The fluid in the conductive gas conduit 132 is further transported through the conductive passage 103 to the backside of the substrate 102. In one embodiment, the fluid may be a gas, such as but not limited to, helium, argon, and hydrogen. The gas may provide heating or cooling to the backside of the substrate 102.

The electrostatic chuck 105 includes one or more chucking electrodes 110a, 110b embedded within and disposed in an upper region of the electrostatic chuck 105 to provide the necessary electrostatic chucking force to retain the substrate 102 when charged. The chucking electrodes 110a, 110b are fabricated from a conductive material, such as but not limited to, tungsten, graphite and copper. The chucking electrodes 110a, 110b may be configured in any manner necessary to electrostatically retain the substrate 102. In the embodiment depicted in FIG. 1, the chucking electrodes 110a, 110b are in a bipolar configuration.

Each of the chucking electrodes 110a, 110b are respectively connected to the voltage supplies 162 and 164 arranged in series within a dual power supply 140 such that each of the voltage supplies 162 and 164 are configured to independently generate voltages for the respective chucking electrodes. The voltage supply 162 is coupled to the chucking electrode 110a via a lead wire 163, and the voltage supply 164 is coupled to the chucking electrode 110b via a lead wire 165. The voltage supply 162 is also coupled to the voltage supply 164 at a center-tap terminal 166b that is connected to a center-tap terminal 166a exposed to the bottom surface of the substrate 102 between the chucking electrodes 110a and 110b. The center-tap terminals 166a and 166b are the two ends of the connection 166. The connection 166 is coupled to a center-tap cable 167. The voltage at the center-tap terminals 166a and 166b are equal and hence the voltage at the bottom surface of the substrate 102 is measured by a voltage measurement unit 168 connected to the center-tap cable 167. The voltage measurement unit 168 also measures the voltages generated by the voltage supplies 162 and 164 via connecting wires 168a and 168b respectively.

The electrostatic chucking force generated by each chucking electrode 110a, 110b is proportional to the square of the voltage difference between the voltage generated by the voltage supply 162 (or 164) coupled to the chucking electrode 110a (or 110b) and the voltage at the center-tap terminals 166a, 166b. Hence, the measurement of the voltage at the center-tap terminals 166a, 166b is required to measure the electrostatic chucking force generated by the chucking electrodes 110a and 110b. The measurement of the voltage at the center-tap terminals 166a, 166b informs how much voltage should the voltage supplies 162 and 164 be configured to generate such that the electrostatic chucking forces generated by the chucking electrodes 110a and 110b are equal. Thus the electrostatic chucking forces at the two ends of the substrate 102 are balanced.

Figure 2:
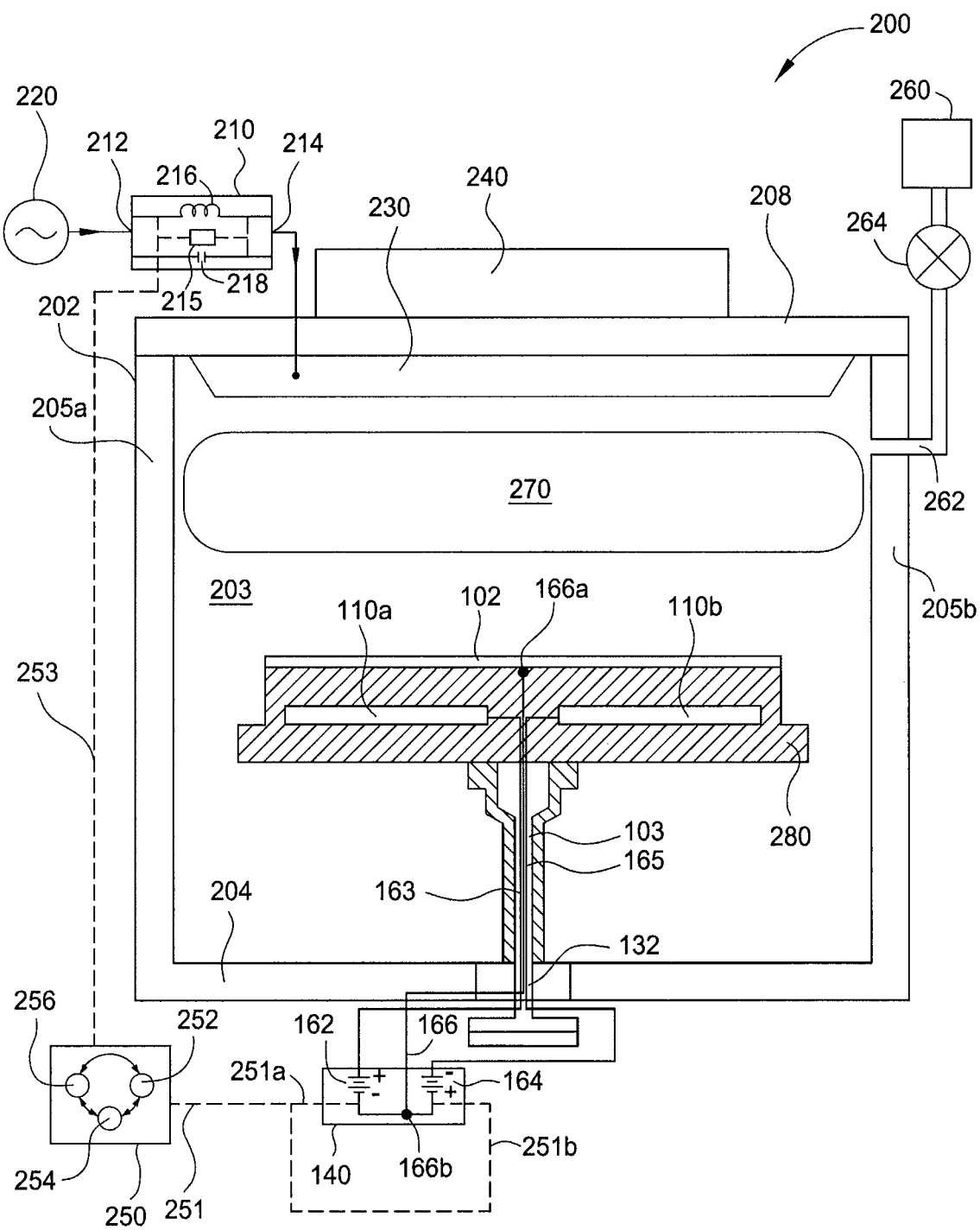
FIG. 2 is a schematic cross-sectional view of an improved system for plasma processing a substrate, according to one embodiment of the present disclosure.

FIG. 2 is a schematic cross-sectional view of an improved substrate processing system 200 for plasma processing a substrate that includes components for balancing the force generated by the bipolar electrostatic chuck, according to one embodiment of the present disclosure. The substrate processing system 200 may be a PVD processing system, such as but not limited to, the Galileo®, the Gauss®, the Cirrus®, the ALPS® Plus and the SIP Encore® PVD processing chambers available from Applied Materials, Inc. of Santa Clara, Calif. While the embodiment of the system 200 described herein is a physical vapor deposition (PVD) system, it is contemplated that the disclosure described herein can be embodied in other plasma processing systems where a bipolar electrostatic chuck is utilized, such as etching, implanting, annealing, depositing, and plasma-treating systems.

The substrate processing system 200 includes a plasma processing chamber 201, a radio-frequency (RF) matching circuit 210, a sensor 215 and a controller 250. The plasma processing chamber 201 has a chamber body 202 with an inner volume 203. The chamber body 202 has sidewalls 205a and 205b, a bottom wall 204 and a lid 208. The sidewalls 205a and 205b, chamber lid 208 and the bottom wall 204 may be formed from conductive materials, such as aluminum or stainless steel. The sidewalls 205a and 205b and bottom wall 204 may be electrically grounded during operation of the chamber. A process gas source 260 is fluidly connected by a conduit 262 to the inner volume 203 to provide one or more processing gases. A flow controller 264 may be coupled between the process gas source 260 and the inner volume 203 to control the gas flow into the inner volume 203.

A sputtering target 230 is disposed under the lid 208 in an upper portion of the inner volume 203. A magnetron 240 is disposed over the lid 208 above the target 230. The magnetron 240 may include a plurality of magnets (not shown) supported by a base plate (not shown) connected to a shaft (not shown), which may be axially aligned with the central axis of the processing chamber 201 and the substrate 102. In one embodiment, the magnets in the magnetron 240 produce a magnetic field within the processing chamber 201 near the front face of the target 230 to generate a plasma 270, such that a significant flux of ions strike the target 230, causing sputter emission of material from the target 230. The magnets in the magnetron 240 may be rotated about the shaft to increase uniformity of the magnetic field across the surface of the target 230. In one embodiment, the magnets in the magnetron 240 may be both rotated and moved reciprocally in a linear direction parallel or substantially parallel to the face of the target 230 to produce a spiral motion. In another embodiment, the magnets in the magnetron 240 may be rotated about both a central axis and an independently-controlled secondary axis to control both their radial and angular positions.

A bipolar electrostatic chuck 280 is disposed within the inner volume 203 and has a substrate 102 disposed thereon. The electrostatic chuck 280 includes chucking electrodes 110a, 110b and is electrically coupled to a dual power supply 140, which is the source of the chucking voltage for the electrostatic chuck. The power supply 140 comprises a pair of voltage supplies 162 and 164, arranged in series and electrically connected to the electrodes 110a and 110b respectively. The voltage supplies 162 and 164 are configured to independently generate voltages for the respective chucking electrodes 110a and 110b respectively. The voltage supply 162 is coupled to the chucking electrode 110a via a lead wire 163, and the voltage supply 164 is coupled to the chucking electrode 110b via a lead wire 165. The lead wires 163 and 165 connecting the power supply 140 to the chucking electrodes 110a, 110b pass through a passage 103 extending through the electrostatic chuck 280 and a conductive gas conduit 132. The voltage supply 162 is coupled to the voltage supply 164 at a center-tap terminal 166b that is connected to a center-tap terminal 166a exposed to the bottom surface of the substrate 102. The center-tap terminals 166a and 166b are the two ends of the connection 166.

Continuing to refer to FIG. 2, a radio-frequency (RF) power source 220 is coupled to the chamber 201 and provides RF power to the target 230 to drive the plasma 270 in the chamber 201. The power source 220 provides RF power to the target 230 up to about 40 kW, and at a frequency between about 1-60 MHz.

An RF matching circuit 210 connects the chamber 201 to the RF power source 220 and has circuitry including at least one inductor 216 and one capacitor 218. The RF matching circuit 210 includes an input terminal 212 connecting to the RF power source 220 and an output terminal 214 connecting to the chamber 201 for delivering RF power to the plasma 270.

A sensor 215 is disposed within the RF matching circuit 210 to detect a change in an electrical characteristic at the RF matching circuit 210. In one embodiment, the sensor 215 reads input and output data from the input and output terminals 212 and 214 of the RF matching circuit 210, such as voltage and/or current. In one embodiment, the sensor 215 monitors and measures at least one or both of the load voltage across capacitor(s) 218 and the tune voltage across inductor(s) 216 within the RF matching circuit 210.

A controller 250 is connected to the power supply 140 via a connecting wire 251 and regulates the chucking voltage applied by the voltage supplies 162 and 164 within the power supply 140 to the electrodes 110a and 110b respectively of the electrostatic chuck 280. The controller 250 is connected to the voltage supply 162 via a connecting wire 251a and the voltage supply 164 via a connecting wire 251b. The controller 250 is also communicatively connected to the sensor 215 in the RF matching circuit 210 by means of a connector 253. The controller 250 includes a central processing unit (CPU) 252, a memory 254, and a support circuit 256. The CPU 252 is any form of a general-purpose computer processor that may be used in an industrial setting. Software routines are stored in the memory 254, which may be a random access memory, a read-only memory, floppy, a hard disk drive, or other form of digital storage. The software routines may include process control software, such as for example, FSS® software by Applied Materials, Inc., of Santa Clara, Calif., as well as programmed instructions for controlling the position of the substrate 102, flow of the gas from the gas source 260, regulation of chucking voltage of the electrostatic chuck 280, and processing of the substrate 102 in the chamber 201, among others. The support circuit 256 is conventionally coupled to the CPU 252 and may include cache, clock circuits, input/output systems, power supplies, and the like.

The substrate processing system 200 for plasma processing a substrate 102 is adapted to adjust and balance the chucking force applied to the substrate 102 by the chucking electrodes 110a, 110b of the electrostatic chuck 280. The principle behind the improvement comes from the observed and thereafter modeled relationship between the changes in voltage at the center-tap terminals 166a, 166b of a conventional electrostatic chuck (such as the electrostatic chuck 105 depicted in FIG. 1) and the changes in load voltage across the capacitor(s) 218 and the tune voltage across the inductor(s) 216 of the RF matching circuit 210 in response to changes in the conditions of the plasma 270. The modeled relationship accurately predicts the center-tap voltage based on the load voltage across the capacitor(s) 218 and the tune voltage across the inductor(s) 216 of the RF matching circuit 210. A linear correlation under typical operating conditions has been experimentally verified by using data from a comprehensive range of operating conditions. Therefore, in one embodiment of the disclosure, a linear regression process can be used to predict a "virtual" center-tap voltage and adjust the chucking voltage applied to the electrostatic chuck 280 in response to the predicted virtual center-tap voltage. However, more complex non-linear models, such as but not limited to support vector machines, may be used in other embodiments where the relationship is not linear and first order.

While the substrate processing system 200 can be used in any plasma process where a bipolar electrostatic chuck is utilized, such as etching, implanting, annealing, depositing, and plasma-treating a material on the substrate, the example described herein shows a particular application to the PVD process.

During a PVD process, a gas mixture that may include one or more reactive gases and one or more inert gases is delivered to the inner volume 203 of the chamber 201 from the gas source 260. Powered by the RF power source 220, the plasma 270 is formed from the gas mixture disposed between the target 230 and the substrate 102. The plasma 270 includes ions of the inert gas(es) and the reactive gas(es). During sputtering, the target 230 is bombarded by ions strongly accelerated by the potential difference between the target 230 and the plasma 270 and confined by the magnetic field created by the magnetron 240. The bombardment ejects the material of the target 230. In some embodiments, the ejected target material then reacts with the reactive gas(es) to form a layer deposited on the substrate 102. The material deposited from the target to the substrate may be titanium, aluminum oxide, aluminum, copper, tantalum, tantalum nitride, tungsten, or tungsten nitride, among other materials. The reactive gas(es) may include an oxidizing agent, a nitriding agent, or other reactive gases. According to one embodiment of the disclosure, the reactive gas(es) may be oxygen for forming a metal oxide layer, or nitrogen for forming a metal nitride layer on the substrate 102. The inert gas(es) may include argon or xenon.

The RF matching circuit 210 transforms the impedance of the load (i.e., the plasma 270) to a value that equals or matches the characteristic impedance of the RF power source 220 coupled to the chamber 201. At the matching point, optimum power is delivered into the plasma 270 without any significant loss of RF power and without reflecting power back to the RF power source 220. Tuning to the matching point is accomplished by appropriately varying the variable reactance of the capacitor(s) 218 and inductor(s) 216 within the RF matching circuit 210 in response to the load impedance of the plasma 270.

The sensor 215 is utilized to detect a change in the electrical characteristic at the RF matching circuit 210 and communicate the detection to the controller 250 via the connector 253. In one example, the sensor 215 monitors the electrical input/output data such as one or both of the load voltage across the capacitor(s) 218 and the tune voltage across the inductor(s) 216 in the RF matching circuit 210. The monitored data is then communicated to the controller 250 where changes in the monitored data may be determined and processed.

The controller 250 receives the monitored data from the sensor 215 and predicts a virtual center-tap voltage in response to the data. The predicted virtual center-tap voltage may be based on the modeled relationship between the changes in voltage at the center-tap terminals 166a, 166b (of a conventional electrostatic chuck) and the changes in load voltage across the capacitor(s) 218 and the tune voltage across the inductor(s) 216 of the RF matching circuit 210. The model may be derived from empirical data obtained using center-tap voltage information and information obtained by the sensor 215 from the RF matching circuit 210. The prediction of the virtual center-tap voltage may be performed by the software in the controller 250. The predicted target value of the virtual center-tap voltage is then communicated by the controller 250 to the voltage supplies 162 and 164 via the connecting wires 251a and 251b respectively. The voltage supplies 162 and 164 adjust the voltages applied to the chucking electrodes 110a and 110b respectively so that any variation in the electrostatic chucking forces between each of the chucking electrodes 110a, 110b and the substrate 102 is removed, thus balancing the electrostatic chucking force on the substrate.

Figure 3:
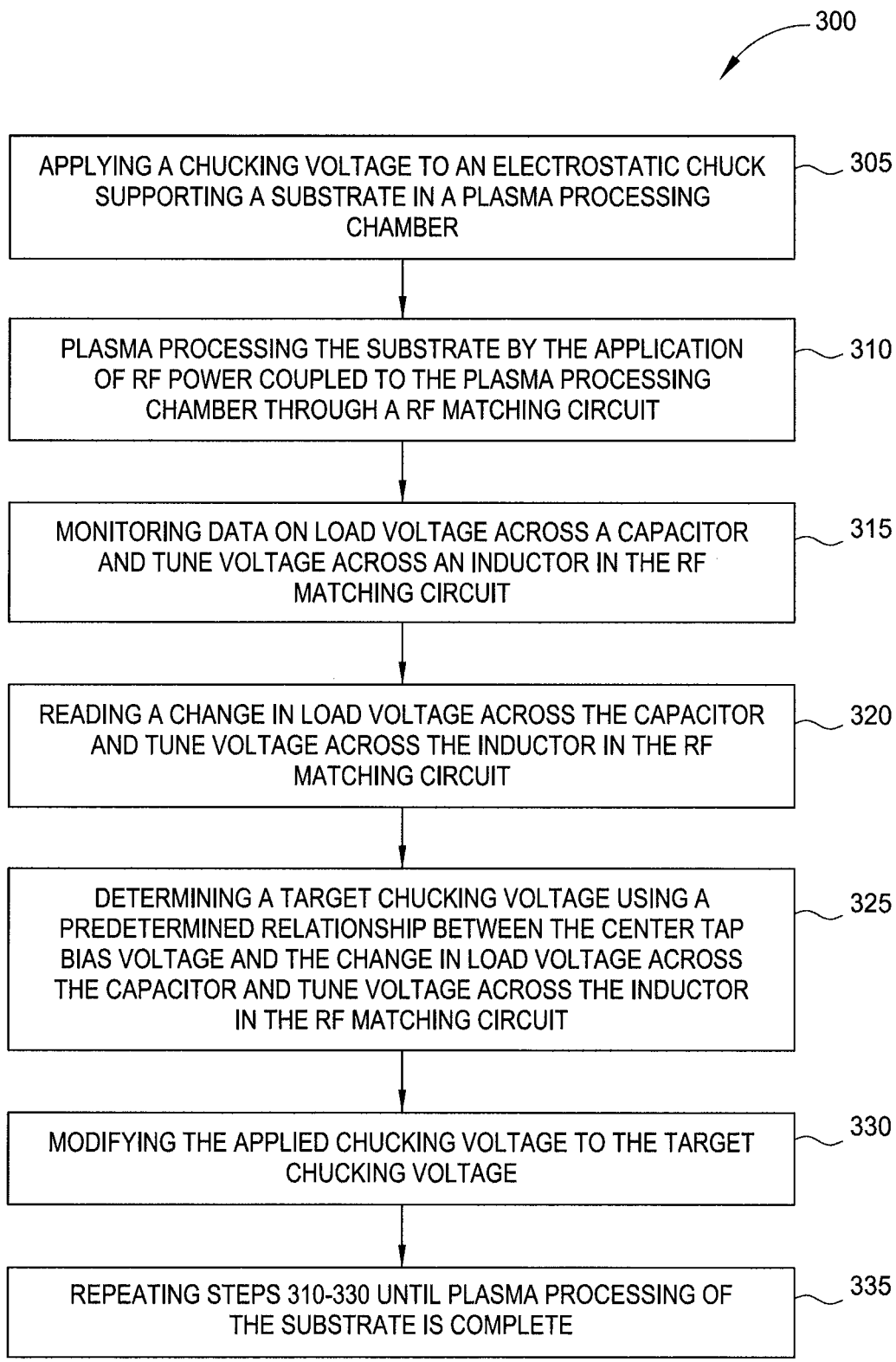
FIG. 3 is an improved method for plasma processing a substrate in a plasma processing chamber, according to another embodiment of the present disclosure.

FIG. 3 is flow diagram for an improved method for processing a substrate while balancing the electrostatic chucking force on the substrate in a plasma processing chamber, according to another embodiment of the present disclosure. The method 300 begins at block 305 by applying a chucking voltage to an electrostatic chuck supporting a substrate in a plasma processing chamber. As mentioned above, the voltage applied from the each of the voltage supplies via lead wires to the chucking electrodes creates localized bipolar electrostatic attraction between the electrostatic chuck and the substrate, resulting in a chucking force that holds the substrate to the electrostatic chuck for plasma processing.

At block 310, the substrate is plasma processed within the plasma processing chamber by application of RF power from an RF power source through an RF matching circuit. Plasma processing may include such processes as etching, implanting, annealing, depositing, and plasma-treating material on the substrate 102, among other processes. At block 315, a sensor is used to monitor a change in an electrical characteristic at the RF matching circuit. For example, the sensor may monitor and measure at least one or both of the load voltage across a capacitor and the tune voltage across an inductor in the RF matching circuit. The collected measurements are subsequently communicated as data to a controller.

At block 320, a controller receives the data indicative of an electrical characteristic at the RF matching circuit. As discussed above, the data may be indicative of changes in one or both the load voltage across the capacitor and the tune voltage across the inductor in the RF matching circuit.

At block 325, the controller uses a predetermined relationship between electrical characteristic at the RF matching circuit to determine a target chucking voltage for the electrostatic chuck. For example, the relationship between the chucking voltage and one or both of the change in the load voltage across the capacitor and the tune voltage across the inductor in the RF matching circuit is used to determine a target chucking voltage for the electrostatic chuck.

At block 330, the controller modifies the chucking voltage applied by the power supply to the electrostatic chuck to meet the target chucking voltage, thus balancing the forces generated by the chucking electrodes. For example, the controller communicates the target chucking voltage to the voltage supplies, which adjust the voltages applied to the chucking electrodes so that any variation in the electrostatic chucking forces between each of the chucking electrodes and the substrate is removed. As a result, the electrostatic chucking force is balanced and uniformly applied over the substrate, thus reducing the potential for substrate breakage and contamination.

At block 335, the steps 310-330 are repeated until the plasma processing of the substrate is complete. For example, plasma processing may be complete once a layer of a material has been deposited on the substrate by a physical vapor deposition process utilizing the plasma.

The system 200 and the method 300 described above provide an improved way of balancing the electrostatic chucking force on a substrate by adjusting the chucking voltage of an electrostatic chuck to remove any variation in chucking force. The improvement is enabled by predicting a virtual center-tap voltage without an actual measurement of the voltage at the center-tap terminals in the electrostatic chuck. Advantageously, the center-tap sensors and cables within the electrostatic chuck are no longer needed, thus removing a potential source for arcing while reducing the cost of the electrostatic chuck. In one example, the improvement further enables the chucking voltage of the electrostatic chuck to have a reduced variation from 70V to 10V for each electrode, resulting in a total reduction of the variation in the chucking voltage for both electrodes from about 140V to 20V, thus enabling better process uniformity and improved production yields.

While the foregoing is directed to particular embodiments of the present disclosure, it is to be understood that these embodiments are merely illustrative of the principles and applications of the present invention. It is therefore to be understood that numerous modifications may be made to the illustrative embodiments to arrive at other embodiments without departing from the spirit and scope of the present inventions, as defined by the appended claims.

What is claimed is:

1. A method for plasma processing a substrate, the method comprising:
    applying a chucking voltage to an electrostatic chuck supporting a substrate in a plasma processing chamber;
    energizing a plasma within the plasma processing chamber by the application of radio-frequency (RF) power coupled to the plasma processing chamber through a radio-frequency (RF) matching circuit;
    detecting a change in an electrical characteristic at the RF matching circuit; and
    adjusting the chucking voltage in response to the change in the electrical characteristic.

2. The method of claim 1, wherein plasma processing comprises at least one of etching, implanting, annealing, depositing, and plasma-treating material on the substrate.

3. The method of claim 1, wherein detecting a change in an electrical characteristic at the RF matching circuit comprises:
    monitoring electrical input-output data at the RF matching circuit.

4. The method of claim 1, wherein adjusting the chucking voltage in response to the change in the electrical characteristic comprises:

reading electrical input-output data at the RF matching circuit;

using a predetermined relationship between the chucking voltage and the change in electrical characteristic to determine a target chucking voltage; and modifying the chucking voltage to the target chucking voltage.

5. The method of claim 4, wherein adjusting the chucking voltage in response to the change in the electrical characteristic further comprises:

repeatedly determining a new target chucking voltage and modifying the chucking voltage to the new target chucking voltage.

6. The method of claim 4, wherein the predetermined relationship is based on linear regression between the chucking voltage and the change in the electrical characteristic.

7. The method of claim 4, wherein the predetermined relationship is based on non-linear relationship between the chucking voltage and the change in the electrical characteristic.

8. A method for processing a substrate in a plasma processing chamber, comprising:

disposing a substrate on an electrostatic chuck, the electrostatic chuck disposed in a plasma processing chamber;

applying chucking voltage to the electrostatic chuck;

energizing a plasma within the chamber by the application of RF power coupled to the chamber through an RF matching circuit;

detecting a change in an electrical characteristic at the RF matching circuit;

adjusting the chucking voltage in response to the change in the electrical characteristic; and depositing a layer of a material on the substrate by a physical vapor deposition process utilizing the plasma.

9. The method of claim 8, wherein detecting the change in the electrical characteristic at the matching circuit comprises:

monitoring electrical input-output data at the RF matching circuit.

10. The method of claim 8, wherein adjusting the chucking voltage in response to the change in the electrical characteristic comprises:

reading electrical input-output data at the RF matching circuit;

using a predetermined relationship between the chucking voltage and the change in electrical characteristic to determine a target chucking voltage; and modifying the chucking voltage to the target chucking voltage.

11. The method of claim 10, wherein the predetermined relationship is based on linear regression between the chucking voltage and the change in the electrical characteristic.

12. The method of claim 10, wherein the predetermined relationship is based on non-linear relationship between the chucking voltage and the change in the electrical characteristic.

13. The method of claim 8, wherein adjusting the chucking voltage in response to the change in the electrical characteristic further comprises:

repeatedly determining a new target chucking voltage and modifying the chucking voltage to the new target chucking voltage.

14. A system for plasma processing a substrate, comprising:

a plasma processing chamber comprising:
  a chamber body having an inner volume; and
  a bipolar electrostatic chuck disposed in the inner volume, the bipolar electrostatic chuck having a pair of electrodes embedded within;
  a first power supply configured to provide chucking voltage to the electrodes; and
  a second power supply configured to energize a plasma within the processing chamber by application of power through a radio-frequency (RF) matching circuit coupled to the chamber;
  a sensor configured to detect a change in an electrical characteristic at the RF matching circuit; and
  a controller coupled to the power supply and configured to adjust the chucking voltage in response to the change in the electrical characteristic detected by the sensor.

15. The system of claim 14, further comprising:

a sputtering target disposed in an upper portion of the inner volume.

16. The system of claim 14 wherein the sensor is further configured to monitor data on load voltage and tune voltage in the RF matching circuit.

17. The system of claim 14, further comprising:

a controller configured to use a predetermined relationship between the chucking voltage and the change in electrical characteristic to modify the chucking voltage.

* * * * *